United States Patent
Kim et al.

(10) Patent No.: US 9,698,972 B2
(45) Date of Patent: Jul. 4, 2017

(54) VOLTAGE MODE DRIVERS AND ELECTRONIC APPARATUS HAVING THE SAME

(71) Applicant: Samsung Electronics Co., Ltd., Suwon-si, Gyeonggi-do (KR)

(72) Inventors: Kangjik Kim, Jeonju-si (KR); Sanghune Park, Seongnam-si (KR); Jaehyun Park, Seoul (KR); Jongshin Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/048,412

(22) Filed: Feb. 19, 2016

(65) Prior Publication Data

US 2016/0294381 A1 Oct. 6, 2016

(30) Foreign Application Priority Data

Apr. 3, 2015 (KR) ........................ 10-2015-0047441

(51) Int. Cl.
*H03K 17/28* (2006.01)
*H04L 7/04* (2006.01)
*H03K 5/08* (2006.01)
*H03K 5/1534* (2006.01)
*H04L 25/02* (2006.01)
*H03K 17/14* (2006.01)
*H03K 5/22* (2006.01)

(52) U.S. Cl.
CPC .............. *H04L 7/04* (2013.01); *H03K 5/08* (2013.01); *H03K 5/1534* (2013.01); *H04L 25/028* (2013.01); *H04L 25/0272* (2013.01); *H04L 25/0278* (2013.01); *H03K 5/22* (2013.01); *H03K 17/14* (2013.01)

(58) Field of Classification Search
CPC ........ H03K 17/28; H03K 5/08; H03K 5/1534; H04L 7/04
See application file for complete search history.

(56) References Cited

U.S. PATENT DOCUMENTS

| 7,307,458 B1 * | 12/2007 | Segervall ............ G06F 13/4072 326/30 |
| 7,312,643 B2 | 12/2007 | Yanagihara |
| 7,486,117 B2 | 2/2009 | Yanagihara |
| 7,859,239 B2 | 12/2010 | Yamada |
| 8,405,371 B2 | 3/2013 | Lam et al. |

(Continued)

FOREIGN PATENT DOCUMENTS

| CN | 101836351 A | 9/2010 |
| JP | 2004-289750 | 10/2004 |

(Continued)

*Primary Examiner* — Don Le
(74) *Attorney, Agent, or Firm* — Myers Bigel, P.A.

(57) ABSTRACT

Voltage mode drivers and an electronic apparatus having the same are provided. The voltage mode drivers may include a voltage regulator and a ripple compensation unit connected to an output terminal of the voltage regulator and configured to compare a current data bit of a data pattern with a previous data bit of the data pattern in synchronization with a clock signal input into the ripple compensation unit, generate a control signal when the current data bit is equal to the previous data bit, and apply a ground voltage to the output terminal in response to the control signal.

20 Claims, 16 Drawing Sheets

(56) References Cited

U.S. PATENT DOCUMENTS

| | | | | |
|---|---|---|---|---|
| 8,593,217 B1* | 11/2013 | Kong | ............... | H03H 15/00 |
| | | | | 327/554 |
| 2010/0026251 A1* | 2/2010 | Lam | ............... | H02M 3/158 |
| | | | | 323/273 |
| 2012/0161731 A1* | 6/2012 | Voutilainen | ............ | H02M 3/07 |
| | | | | 323/273 |
| 2013/0082744 A1* | 4/2013 | Zhong | ............... | H04L 25/0278 |
| | | | | 327/108 |
| 2013/0163126 A1* | 6/2013 | Dong | ............... | G06F 13/4086 |
| | | | | 361/56 |
| 2013/0335135 A1* | 12/2013 | Chen | ............... | H04L 25/0272 |
| | | | | 327/509 |
| 2014/0269975 A1 | 9/2014 | Chong | | |
| 2016/0315641 A1* | 10/2016 | Raghavan | ............ | H04B 1/0475 |

FOREIGN PATENT DOCUMENTS

| | | |
|---|---|---|
| JP | 2009-071987 | 4/2009 |
| KR | 10-1993-0014568 | 7/1993 |
| WO | WO 2010/014393 A1 | 2/2010 |

* cited by examiner

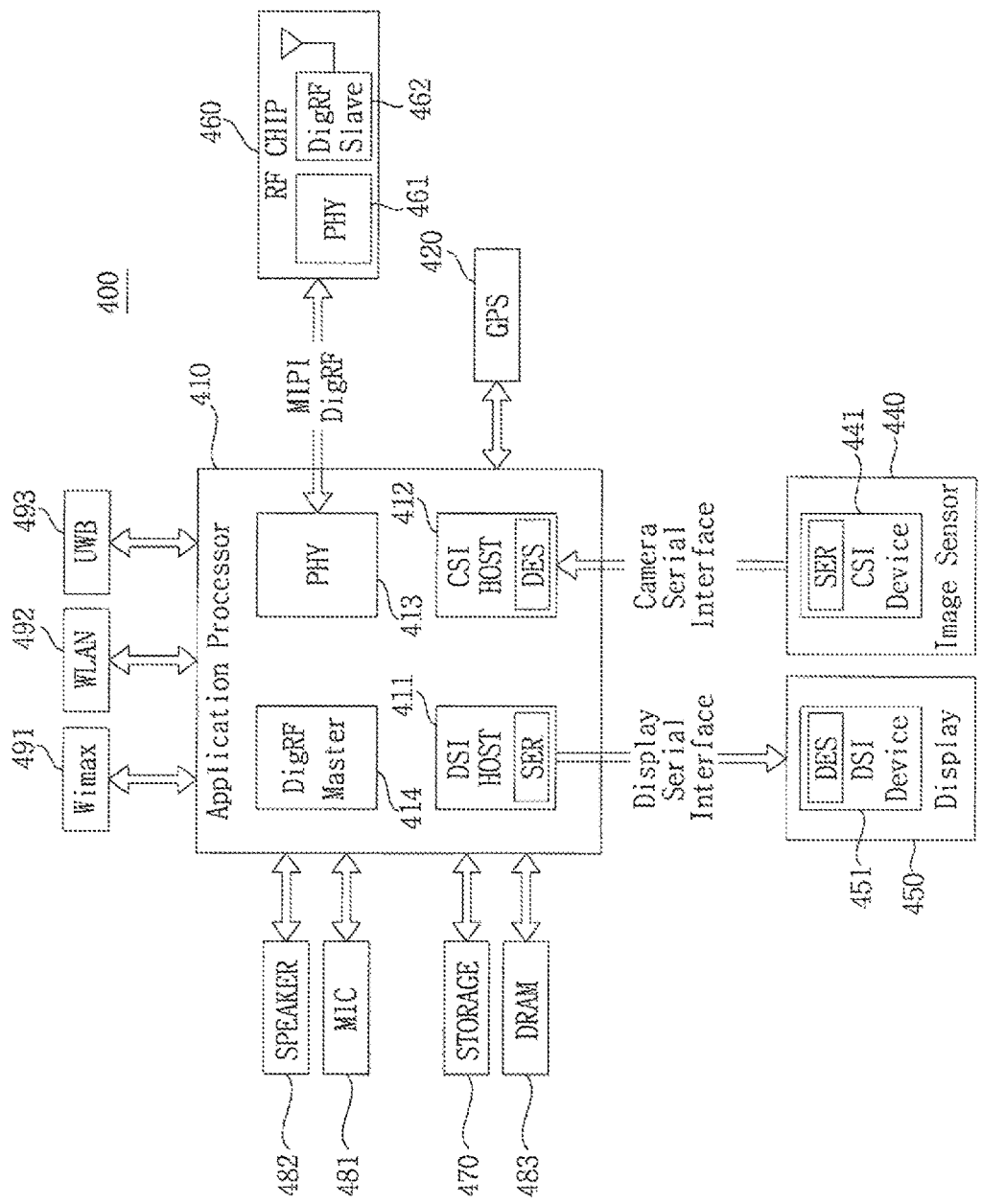

VOLTAGE MODE DRIVERS AND ELECTRONIC APPARATUS HAVING THE SAME

CROSS-REFERENCE TO RELATED APPLICATION

This application claims priority under 35 U.S.C. §119 to Korean Patent Application No. 10-2015-0047441 filed on Apr. 3, 2015, the disclosure of which are incorporated herein by reference in their entirety.

BACKGROUND

Field

Embodiments of the inventive concept relates to voltage mode drivers, and more particularly, to voltage mode drivers capable of compensating for a data pattern-dependent ripple, and an electronic apparatus having the same.

Description of Related Art

Owing to development of the Internet, the amount of data transmission in field of communication is increasing. Moreover, the data stream used for digital videos, high density televisions (HDTVs), and color graphics requires a higher bandwidth.

Data transmission systems for mass data require new interface techniques. The new interface techniques may include a low voltage differential signaling (LVDS) method, a reduced swing differential signaling (RSDS) method, and a scalable low voltage differential signaling (SVDS) method. These interface techniques may have a high bit-rate, low-power consumption, and an outstanding noise characteristic. However, as bit rates increase in transmissions, issues related to output quality of the signals involved become more critical.

SUMMARY

Embodiments of the inventive concepts provide voltage mode drivers capable of compensating for a data pattern-dependent ripple.

Other embodiments of the inventive concepts also provide an electronic apparatus having the voltage mode driver.

The technical objectives of the inventive concepts are not limited to the above disclosure, and other objectives may become apparent to those of ordinary skill in the art based on the following descriptions.

In accordance with aspects of the inventive concepts, a voltage mode driver may include a voltage regulator; and a ripple compensation unit connected to an output terminal of the voltage regulator and configured to compare a current data bit of a data pattern with a previous data bit of the data pattern in synchronization with a clock signal, generate a control signal when the current data bit is equal to the previous data bit, and apply a ground voltage to the output terminal in response to the control signal.

In some embodiments, the voltage mode driver may further include a first switch connected between a first node and a second node; a first resistor connected between the second node and a third node; a second switch connected between the first node and a fourth node; a second resistor connected between the fourth node and a fifth node; a third switch connected between as sixth node and a seventh node, a third resistor connected between the third node and the sixth node; a fourth switch connected between an eighth node and the seventh node; and a fourth resistor connected between the fifth node and the eighth node. The output terminal of the voltage regulator may be connected to the first node and a ground voltage may be applied to the seventh node.

In some embodiments, the voltage mode driver may further include a receiver connected to the voltage mode driver by a transmission line. Each of the first to fourth resistors may have a resistance value for matching an impedance of the receiver.

In some embodiments, the ripple compensation unit may receive the data pattern and extract the previous data bit and the current data bit from the data pattern.

In some embodiments, the ripple compensation unit may operate in synchronization with a rising edge and a failing edge of the clock signal and a period of the clock signal may be a unit interval of the data pattern.

In some embodiments, a width of the control signal may correspond to a data transmission rate of the data pattern.

In some embodiments, the voltage mode driver may transmit the data pattern to a receiver through a transmission line.

In accordance with aspects of the inventive concepts, a voltage mode driver may include a voltage regulator; and a replica circuit connected to an output terminal of the voltage regulator and configured to compare a current data bit with a previous data bit in synchronization with a clock signal, generate a first control signal and a second control signal when the current data bit is equal to the previous data bit, and apply a ground voltage to the output terminal in response to the first control signal or the second control signal.

In some embodiments, the voltage mode driver further may include a first switch connected between a first node and a second node; a first resistor connected between the second node and a third node; a second switch connected between the first node and a fourth node; a second resistor connected between the fourth node and a fifth node; a third switch connected between a sixth node and a seventh node; a third resistor connected between the third node and the sixth node; a fourth switch connected between an eighth node and the seventh node; and a fourth resistor connected between the fifth node and the eighth node. The output terminal of the voltage regulator may be connected to the first node, and a ground voltage may be applied to the seventh node.

In some embodiments, the replica circuit may include a fifth switch connected between the first node and a ninth node, a fifth resistor connected between the ninth node and a tenth node, a sixth switch connected between the first node and an eleventh node, a sixth resistor connected between the eleventh node and a twelfth node, a seventh resistor connected between the tenth node and a thirteenth node, a seventh switch connected between the thirteenth node and a fourteenth node, an eighth resistor connected between the twelfth node and a fifteenth node, and an eighth switch connected between the fourteenth node and the fifteenth node. The ground voltage may be applied to the fourteenth node. The fifth switch and the eighth switch may be activated in response to the first control signal. The sixth switch and the seventh switch may be activated in response to the second control signal.

In some embodiments, the voltage mode driver may include a receiver connected to the voltage mode driver by a transmission line. Each of the first to eighth resistors may have a resistance value for matching an impedance of the receiver.

In some embodiments, the replica circuit may receive the data pattern and extract the previous data bit and the current data bit from the data pattern.

In some embodiments, the replica circuit may operate in synchronization with a rising edge and a falling edge of the clock signal and a period of the clock signal may be a unit interval of the data pattern.

In some embodiments, a width of the first control signal or the second control signal may correspond to a data transmission rate of the data pattern.

In some embodiments, each of the first control signal and the second control signal may have an inverse phase to each other.

In accordance with aspects of the inventive concepts, an electronic apparatus may include a voltage mode driver configured to serialize a data pattern and a receiver configured to receive the serialized data pattern through a transmission line and deserialize the serialized data pattern. The voltage mode driver may include a voltage regulator, and a ripple compensation unit connected to an output terminal of the voltage regulator and configured to compare a current data bit with a previous data bit in synchronization with a clock signal, generate a control signal when the current data bit is equal to the previous data bit, and apply a ground voltage to the output terminal in response to the control signal.

In some embodiments, the voltage mode driver may further include a first switch connected between a first node and a second node, a first resistor connected between the second node and a third node, a second switch connected between the first node and a fourth node; a second resistor connected between the fourth node and a fifth node, a third switch connected between a sixth node and a seventh node; a third resistor connected between the third node and the sixth node, a fourth switch connected between an eighth node and the seventh node, and a fourth resistor connected between the fifth node and the eighth node. The output terminal of the voltage regulator may be connected to the first node and a ground voltage may be applied to the seventh node.

In some embodiments, each of the first to fourth resistors may have a resistance value for matching impedance of a receiver.

In some embodiments, the ripple compensation unit may extract the previous data bit and the current data bit from the data pattern.

In some embodiments, the ripple compensation unit may operate in synchronization with a rising edge and a failing edge of the clock signal and a period of the clock signal may be a unit interval of the data pattern.

In accordance with aspects of the inventive concepts, voltage mode driver may include a voltage regulator, a switching circuit connected to an output terminal of the voltage regulator, connected to an output terminal of the voltage mode driver, and configured to output a data pattern and a data-dependent ripple generation circuit connected to the output terminal of the voltage regulator and configured to generate uniform ripple in the output of the voltage mode driver. The switching circuit may include a plurality of resistors which generate a first electrical load.

In some embodiments, the data-dependent ripple generation circuit may be configured to generate uniform ripple in the output of the voltage mode driver by connecting a second electrical load to the output terminal of the voltage mode driver in response to a comparison of a current data bit of the data pattern with a previous data bit of the data pattern in synchronization with a clock signal.

In some embodiments, the first electrical load and the second electrical load may be substantially the same.

In some embodiments, the data-dependent ripple generation circuit comprises may include a load resistor connected between the output terminal of the voltage mode driver and a first node, a first switch connected between the first node and a second node, and a data pattern analysis unit. The first switch may be controlled by a control signal. The data pattern analysis unit may be configured to compare the current data bit of the data pattern with the previous data bit of the data pattern in synchronization with the clock signal, and generate the control signal when the current data bit is equal to the previous data bit.

In some embodiments, the switching circuit may include a first switch connected between a first node and a second node, a first resistor connected between the second node and a third node, a second switch connected between the first node and a fourth node, a second resistor connected between the fourth node and a fifth node, a third switch connected between a sixth node and a seventh node, a third resistor connected between the third node and the sixth node, a fourth switch connected between an eighth node and the seventh node, and a fourth resistor connected between the fifth node and the eighth node. The output terminal of the voltage regulator may be connected to the first node. The ripple compensation circuit may include a data pattern analysis unit, a fifth switch connected between the first node and a ninth node, a fifth resistor connected between the ninth node and a tenth node, a sixth switch connected between the first node and an eleventh node, a sixth resistor connected between the eleventh node and a twelfth node, a seventh resistor connected between the tenth node and a thirteenth node, a seventh switch connected between the thirteenth node and a fourteenth node, an eighth resistor connected between the twelfth node and a fifteenth node, an eighth switch connected between the fourteenth node and the fifteenth node, a first capacitor between the tenth node and a sixteenth node, and a second capacitor between the twelfth node and a seventeenth node. The data pattern analysis unit may be configured to compare the current data bit of the data pattern with the previous data bit of the data pattern in synchronization with the clock signal and generate a first control signal and a second control signal in synchronization with the clock signal when the current data bit is equal to the previous data bit. The fifth switch and the eighth switch may be activated in response to the first control signal. The sixth switch and the seventh switch are activated in response to the second control signal. The voltage mode driver further may include a third capacitor between the third node and an eighteenth node, and a fourth capacitor between the fifth node and a nineteenth node.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not, necessarily to scale, emphasis instead being placed upon illustrating the principles of the inventive concepts. In the drawings:

FIG. 16 is a block diagram illustrating an embodiment of an interface which may be used in the computing system shown in FIG. 15;

DETAILED DESCRIPTION

Figure 1:
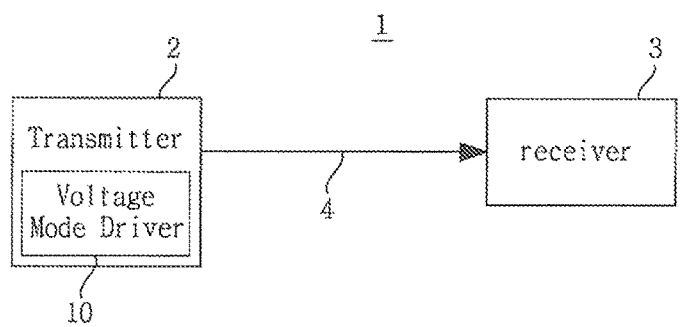
FIG. 1 is a block diagram illustrating an electronic apparatus according to a related art.

Example embodiments of the present inventive concepts are described below in sufficient detail to enable those of ordinary skill in the art to embody and practice the present inventive concepts. It is important to understand that the present invention may be embodied in many alternate forms and should not be construed as limited to the example embodiments set forth herein.

While the inventive concepts are susceptible to various modifications and alternative forms, specific embodiments thereof are shown by way of example in the drawings and will herein be described in detail. It should be understood, however, that there is no intent to limit the inventive concepts to the particular forms disclosed, but on the contrary, the inventive concepts are to cover all modifications, equivalents, and alternatives falling within the spirit and scope of the inventive concepts.

It will be understood that, although the terms "first," "second," "A," "B," etc. may be used herein in reference to elements of the inventive concepts, such elements should not be construed as being limited by these terms. For example, a first element could be termed a second element, and a second element could be termed a first element, without departing from the scope of the present inventive concepts. Herein, the term "and/or" includes any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the inventive concepts are not intended to limit the scope of the invention. The articles "a," "an," and "the" are singular in that they have a single referent, however the use of the singular form in the present document should not preclude the presence of more than one referent. In other words, elements of the inventive concepts referred to as in singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which these inventive concepts belong. It will be further understood that terms in common usage should also be interpreted as is customary in the relevant art and not in an idealized or overly formal sense unless expressly so defined herein.

Meanwhile, when it is possible to implement any embodiment in any other way, a function or an operation specified in a specific block may be performed differently from a flow specified in a flowchart. For example, consecutive two blocks may actually perform the function or the operation simultaneously, and the two blocks may perform the function or the operation conversely according to a related operation or function.

Embodiments of the present inventive concepts will be described below with reference to attached drawings.

FIG. 1 is a block diagram illustrating an electronic apparatus according to a related art. Referring to FIG. 1, the electronic apparatus 1 according to the related art may include a transmitter 2, a receiver 3, and a transmission line 4. The transmitter 2 may include a serializer. Moreover, the receiver 3 may include a deserializer.

The transmitter 2 may convert a parallel data pattern into a serial data pattern. Moreover, the transmitter 2 may transmit the serial data pattern to the receiver 3 through the transmission line 4. In some embodiments, the transmitter 2 may include a voltage mode driver 10.

That is, the voltage mode driver 10 may transmit the serial data pattern to the receiver 3 through the transmission line 4. For example, the voltage mode driver 10 may continuously transmit high signals or low signals to the receiver 3 through the transmission line 4. The voltage mode driver 10 is described in FIG. 2.

The receiver 3 may receive the serial data pattern through the transmission line 4. The receiver 3 may convert the serial data pattern into a parallel data pattern.

In some embodiments, the electronic apparatus 1 may be applied between an application processor and a modem and/or between an application processor and a camera device. For example, when the transmitter 2 is a modem, the receiver 3 may be an application processor.

The electronic apparatus 1 may include a high speed serializer-deserializer (serdes) interface system.

Figure 2:
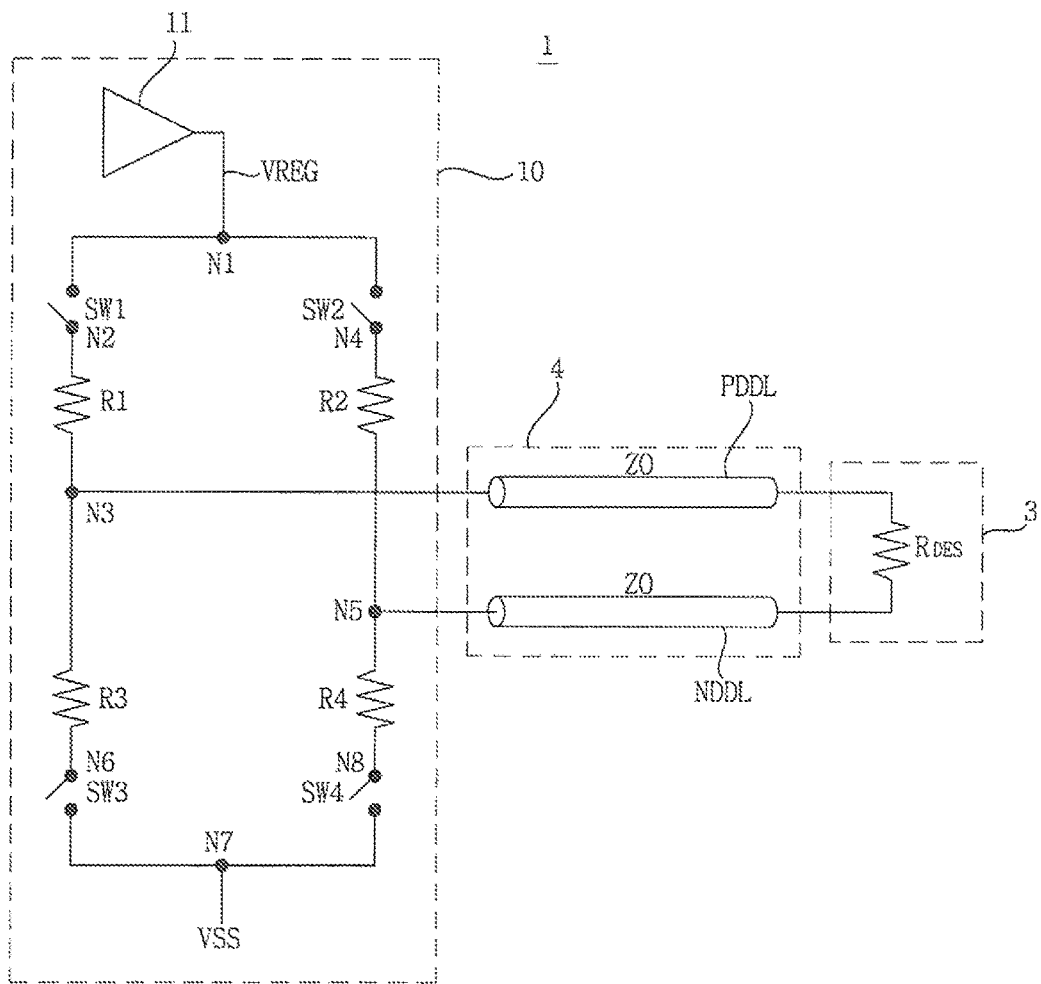
FIG. 2 is a circuit diagram illustrating a voltage mode driver shown in FIG. 1.

FIG. 2 is a circuit diagram illustrating the voltage mode driver shown in FIG. 1. Referring to FIG. 2, the voltage mode driver 10 may include a voltage regulator 11. Further, the voltage mode driver 10 may further include first to fourth switches SW1 to SW4 and first to fourth resistors R1 to R4.

Specifically, the voltage regulator 11 may be connected to a first node N1. The voltage regulator 11 may apply a regulation voltage VREG to the first node N1.

The first switch SW1 may be connected between the first node N1 and a second node N2. The first resistor R1 may be connected between the second node N2 and a third node N3. The second switch SW2 may be connected between the first node N1 and a fourth node N4. The second resistor R2 may be connected between the fourth node N4 and a fifth node N5.

The third resistor R3 may be connected between the third node N3 and a sixth node N6. The third switch SW3 may be connected between the sixth node N6 and a seventh node N7. The fourth resistor R4 may be connected between the fifth node N5 and a eighth node N8. The fourth switch SW4 may be connected between the eighth node N8 and the seventh node N7. Moreover, a ground voltage VSS may be applied to the seventh node N7.

The transmission line 4 may include a positive differential data line PDDL and a negative differential data line NDDL, which may each have an impedance of Z0. The positive differential data line PDDL may be connected between the third node N3 and the receiver 3. The negative differential data line NDDL may be connected between the fifth node N5 and the receiver 3. In some embodiments, each of the positive differential data line PDDL and the negative differential data line NDDL may have an inverse phase to each other. The receiver 3 may be modeled with a deserialization resistor $R_{DES}$.

Each of the first to fourth resistors R1 to R4 may have a resistance value for matching impedance of the receiver 3. For example, when the impedance of the receiver 3 has a resistance value of "R," each of the first to fourth resistors R1 to R4 may have a resistance value of "R/2."

A data pattern in the electronic apparatus 1 may be non-uniform. Because output impedance of the voltage regulator 11 is not "0," a ripple on an output terminal of the voltage regulator 11 may occur. Due to the ripple, jitter in the electronic apparatus 1 may increase.

The voltage regulator 11 according to the related art may include a current source. The current source in the voltage regulator 11 may affect the output terminal of the voltage regulator 11. Accordingly, a ripple depending on the data pattern may occur on an output terminal of the voltage regulator 11.

Figure 3A:
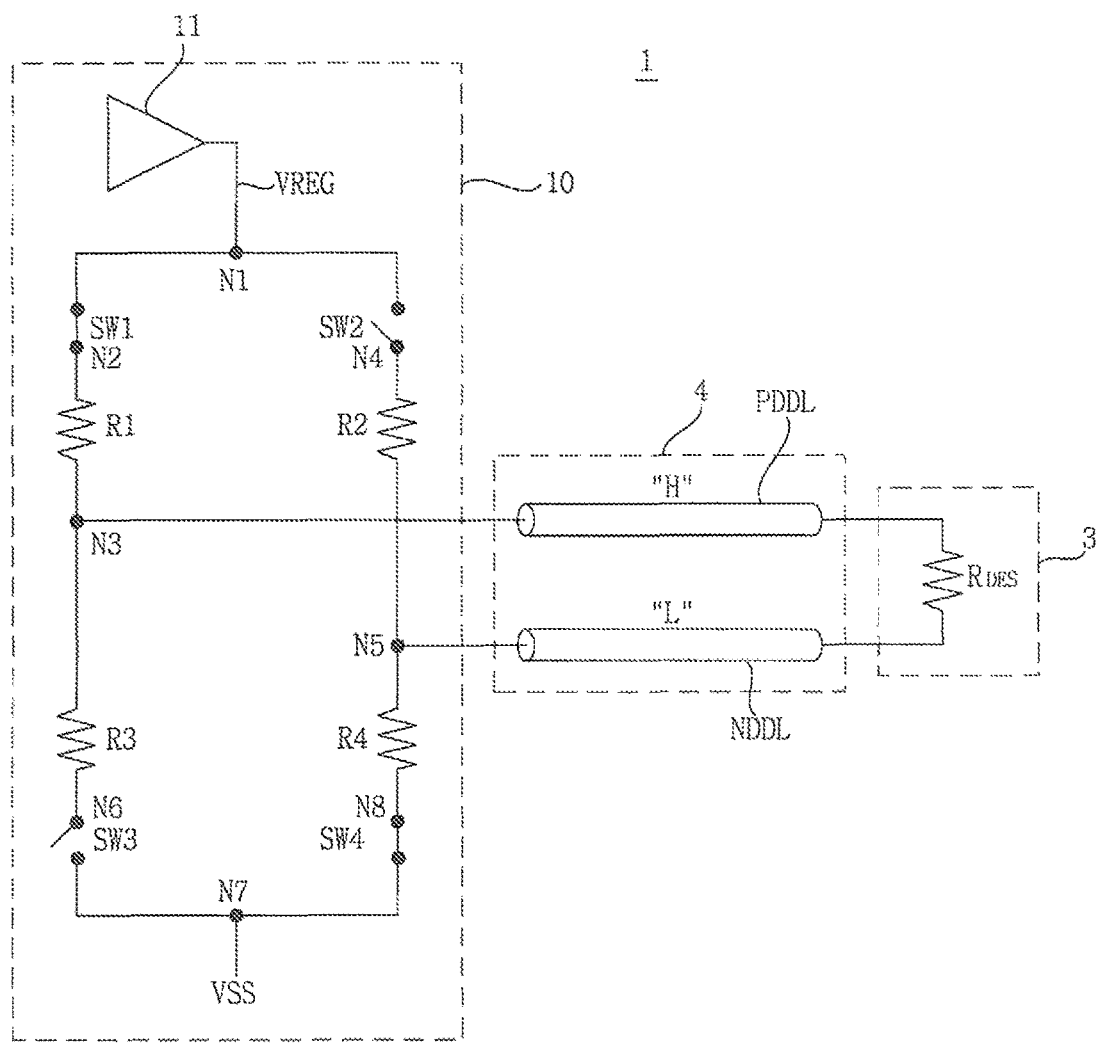
FIGS. 3A and 3B are circuit diagrams for describing an operation of the voltage mode driver shown in FIG. 2.
Figure 3B:
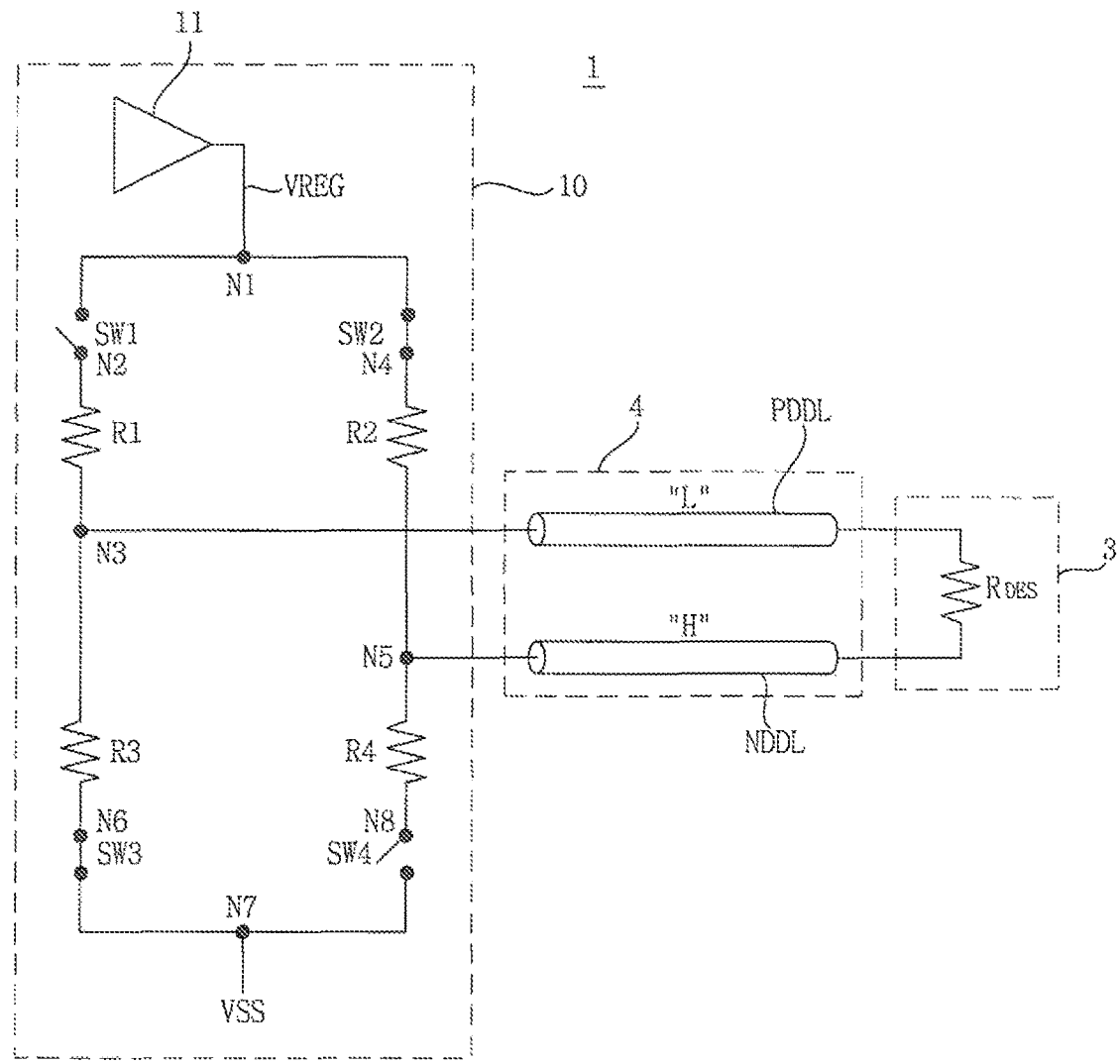

FIGS. 3A and 3B are circuit diagrams for describing an operation of the voltage mode driver shown in FIG. 2. Referring to FIGS. 2 and 3A, each of the first switch SW1 and the fourth switch SW4 may be activated and each of the second switch SW2 and the third switch SW3 may be deactivated in order that the voltage mode driver 10 transmits a logical "1" to the receiver 3 through the transmission line 4.

The voltage regulator 11 may apply the regulation voltage VREG to the positive differential data line PDDL through the first resistor R1. The ground voltage VSS may be applied to the negative differential data line NDDL through the fourth resistor R4. Here, the positive differential data line PDDL may be in a high state and the negative differential data line NDDL may be in a low state.

Referring to FIGS. 2 and 3B, each of the second switch SW2 and the third switch SW3 may be activated and each of the first switch SW1 and the fourth switch SW4 may be deactivated in order that the voltage mode driver 10 transmits a logical "0" to the receiver 3 through the transmission line 4.

The voltage regulator 11 may apply the regulation voltage VREG to the negative differential data line NDDL through the second resistor R2. The ground voltage VSS may be applied to the positive differential data line PDDL through the third resistor R3. Here, the positive differential data line PDDL may be in a low state and the negative differential data line NDDL may be in a high state.

Figure 4:
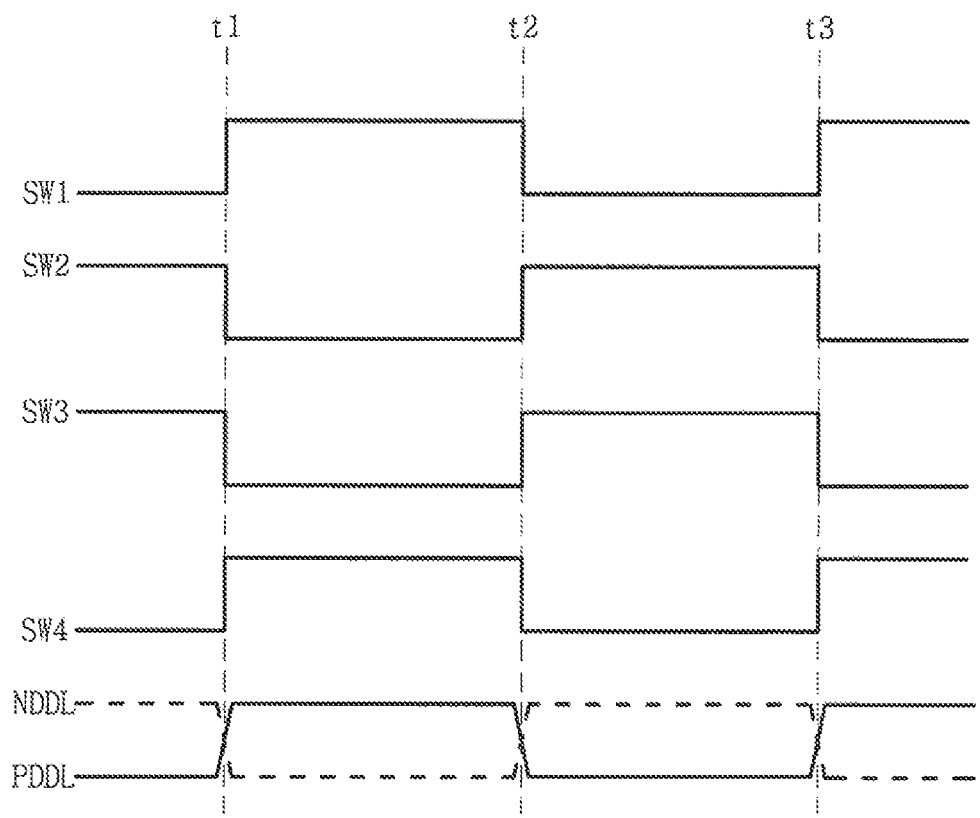
FIG. 4 is a timing diagram illustrating an operation of the voltage mode driver shown in FIGS. 3A and 3B.

FIG. 4 is a timing diagram illustrating an operation of the voltage mode driver shown in FIGS. 3A and 3B. Referring to FIGS. 3A, 3B, and 4, from time t1 to time t2, the voltage mode driver 10 may transmit a logical "1" to the receiver 3 through the transmission line 4.

When each of the first switch SW1 and the fourth switch SW4 is activated and each of the second switch SW2 and the third switch SW3 is activated, the positive differential data line PDDL may be in a high state and the negative differential data line NDDL may be in a low state.

From time t2 to time t3, the voltage mode driver 10 may transmit a logical "0" to the receiver 3 through the transmission line 4.

When each of the second switch SW2 and the third switch SW3 is activated and each of the first switch SW1 and the fourth switch SW4 is deactivated, the positive differential data line PDDL may be in a low state and the negative differential data line NDDL may be in a high state.

Figure 5:
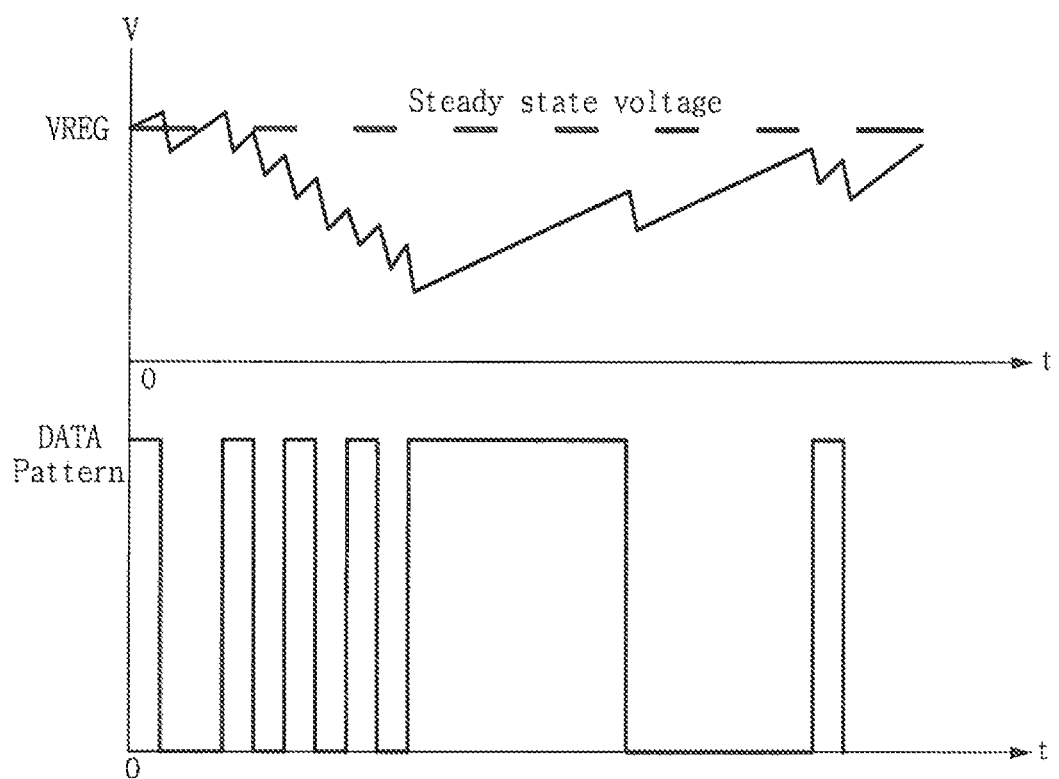
FIG. 5 is a timing diagram illustrating output of the voltage regulator shown in FIG. 2.

FIG. 5 is a timing diagram illustrating output of the voltage regulator 11 shown in FIG. 2. Referring to FIGS. 2 and 5, as described in FIGS. 3A and 3B, the voltage regulator 11 applies the regulation voltage VREG to the transmission line 4, whenever data is output. Here, a ripple which is dependent on the data pattern may occur in the output of the voltage regulator 11.

For example, as soon as data is converted, the regulation voltage VREG may drop. That is, when the data is switched from a "low" to a "high" or the data is switched from a "high" to a "low," the regulation voltage VREG may drop.

Moreover, in an interval that data is toggled, a ripple which irregularly decreases may occur. Further, in an interval that data has a constant value, a ripple which constantly increases may occur.

Generally, when the regulation voltage VREG is stable, jitter of the electronic apparatus 1 may be reduced. However, when the regulation voltage VREG is unstable, jitter of the electronic apparatus 1 may increase. As jitter increases, the receiver 3 may not determine whether the data is in a high state or in a low state.

To solve the above problem, the embodiments of the inventive concepts may provide voltage mode drivers to compensate for a data pattern-dependent ripple.

Figure 6:
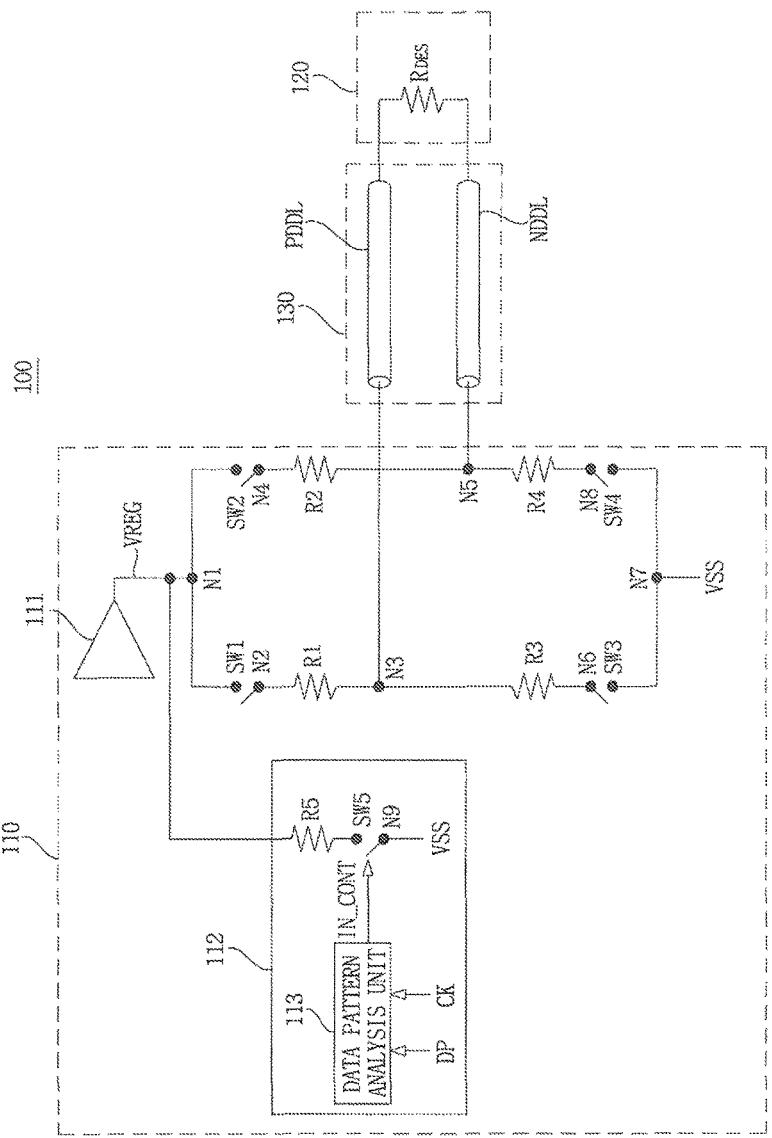
FIG. 6 is a circuit diagram illustrating an electronic apparatus according to embodiments of the inventive concepts.

FIG. 6 is a circuit diagram illustrating an electronic apparatus according to embodiments of the inventive concepts. Referring to FIG. 6, the electronic apparatus 100 may include a voltage mode driver 110, a receiver 120 and a transmission line 130.

The voltage mode driver 110 according to embodiments of the inventive concepts may include a voltage regulator 111. Further, the voltage mode driver 110 may further include first to fourth switches SW1 to SW4 and first to fourth resistors R1 to R4.

Specifically, the voltage regulator 111 may be connected to a first node N1. The voltage regulator 111 may apply a regulation voltage VREG to the first node N1.

The first switch SW1 may be connected between the first node N1 and a second node N2. The first resistor R1 may be connected between the second node N2 and a third node N3. The second switch SW2 may be connected between the first node N1 and a fourth node N4. The second resistor R2 may be connected between the fourth node N4 and a fifth node N5.

The third resistor R3 may be connected between the third node N3 and a sixth node N6. The third switch SW3 may be connected between the sixth node N6 and a seventh node N7. The fourth resistor R4 may be connected between the Fifth node N5 and a eighth node N8. The fourth switch SW4 may be connected between the eighth node N8 and the seventh node N7. Moreover, a ground voltage VSS may be applied to the seventh node N7.

The transmission line 130 may include a positive differential data line PDDL and a negative differential data line NDDL, which may each have an impedance of Z0. The positive differential data line PDDL may be connected between the third node N3 and the receiver 120. The negative differential data line NDDL may be connected between the fifth node N5 and the receiver 120. In some embodiments, each of the positive differential data line PDDL and the negative differential data line NDDL may have an inverse phase to each other. The receiver 120 may be modeled with a deserialization resistor $R_{DES}$.

Each of the first to fourth resistors R1 to R4 may have a resistance value for matching an impedance of the receiver 120. For example, when the impedance of the receiver 120 has a resistance value of "R," each of the first to fourth resistors R1 to R4 may have a resistance value of "R/2."

A data pattern in the electronic apparatus 100 may be non-uniform. Because output impedance of the voltage regulator 111 is not "0," a ripple on the output terminal of the voltage regulator 111 may occur. Due to the ripple, jitter in the electronic apparatus 100 may increase.

To solve the above problem, the voltage mode driver 110 may further include a ripple compensation unit 112. The ripple compensation unit 112 may include a data pattern analysis unit 113, a fifth resistor R5, and a fifth switch SW5. In some embodiments, the resistance value of the fifth resistor R5 may be selected so as to create a load within the ripple compensation unit 112 so as to mimic the load generated by the first through fourth switching resistors, R1 to R4 during switching operation of the voltage mode driver 110.

The data pattern analysis unit 113 may receive a data pattern DP and a clock signal CK. For example, the data pattern analysis unit 113 may receive the serialized data pattern DP.

The data pattern analysis unit 113 may extract a current data bit and a previous data bit from the data pattern DP. Generally, the clock signal CK, which is constant, will be free of jitter which is dependent on the data pattern DP. The data pattern analysis unit 113 may compare the current data bit with the previous data bit in synchronization with the clock signal CK.

In some embodiments, the data pattern analysis unit 113 may compare the current data bit with the previous data bit in synchronization with a rising edge and a falling edge of the clock signal CK. The data pattern analysis unit 113 according to some embodiments of the inventive concepts will be described in FIGS. 7 and 8 in detail.

When the current data bit is equal to the previous data bit, the data pattern analysis unit 113 may generate an input control signal IN_CONT having a pulse form during one cycle of the clock signal CK. That is, the period of the clock signal CK may be a unit interval UI of the data pattern DP.

For example, one data bit which is included in the data pattern DP may correspond to one cycle of the clock signal CK. That is, when the current data bit is compared with the previous data bit in synchronization with a rising edge of the clock signal CK, one data bit, which is included in the data pattern DP, may correspond to one period. Further, when the current data bit is compared with the previous data bit in synchronization with a rising edge and a falling edge of the clock signal CK, two data bits, which are included in the data pattern DP, may correspond to two periods. Accordingly, the period of the clock signal CK may correspond to a period of the data pattern DP.

In response to the input control signal IN_CONT, the fifth switch SW5 may be activated. For example, when the input control signal IN_CONT is activated, the fifth switch SW5 may be turned on. When the fifth switch SW5 is turned on, the ground voltage VSS may be applied to the first node N1. Further, when the input control signal IN_CONT is deactivated, the fifth switch SW5 may be turned off.

The ripple compensation unit 112 according to embodiments of the inventive concepts may affect the output terminal of the voltage regulator 111. That is, because the input control signal IN_CONT may be generated in synchronization with the clock signal CK in which there is little or no jitter, unpredictable fluctuation on the output terminal of the voltage regulator 111 may be removed or reduced.

The voltage mode driver 110 may mimic the same data pattern as a clock pattern having a small amount of jitter using the current data bit and the previous data bit.

Figure 7:
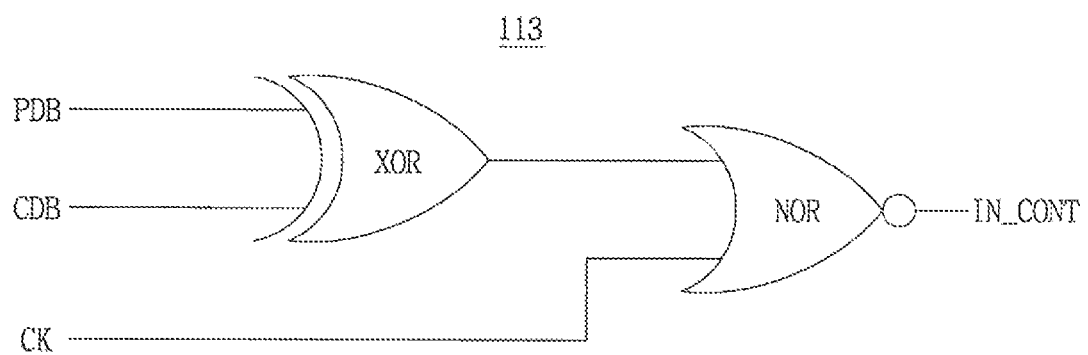
FIG. 7 is a circuit diagram illustrating an embodiment of the data pattern analysis unit shown in FIG. 6 in detail.

FIG. 7 is a circuit diagram illustrating an embodiment of the data pattern analysis unit shown in FIG. 6 in detail. Referring to FIGS. 6 and 7, the data pattern analysis unit 113 according to embodiments of the inventive concepts may receive the serialized data pattern DP.

The data pattern analysis unit 113 may extract a current data bit CDB and a previous data bit PDB from the data pattern DP.

The data pattern analysis unit 113 may compare the current data bit CDB with the previous data bit PDB. When the current data bit CDB is equal to the previous data bit PDB, the data pattern analysis unit 113 may output the input control signal IN_CONT in synchronization with the clock signal CK.

The data pattern analysis unit 113 may include an XOR gate and a NOR gate. The current data bit CDB and the previous data bit PDB are input to the XOR gate. An output signal of the XOR and the clock signal CK may be input to the NOR gate. An operation of the data pattern analysis unit 113 shown in FIG. 7 will be described in FIG. 8 in detail.

Further, the data pattern analysis unit 113 may extract a current data bit and a data bit where the current data bit is delayed, from the data pattern DP. The data pattern analysis unit 113 may compare the current data bit with the delayed data bit and output the input control signal IN_CONT.

Figure 8:
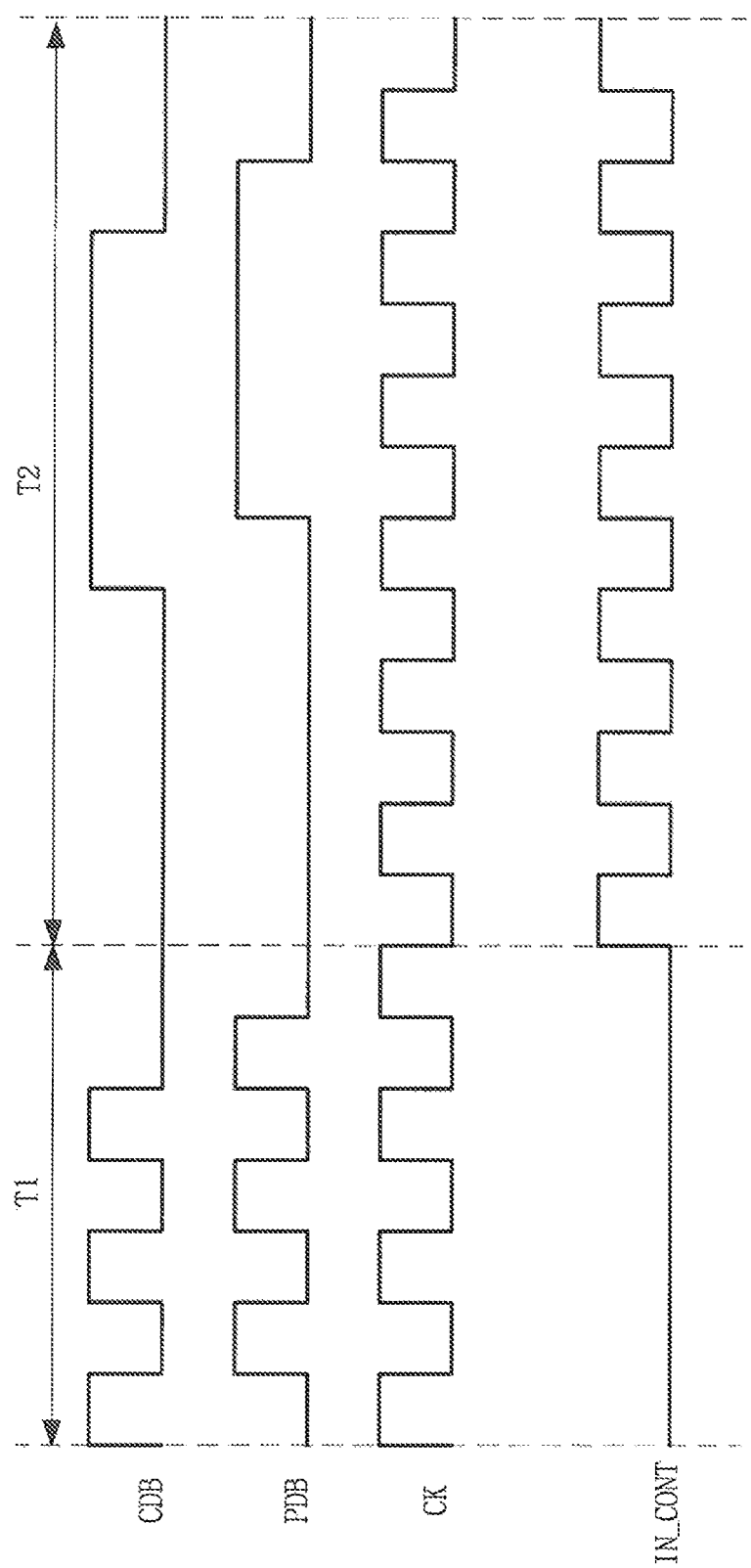
FIG. 8 is a timing diagram illustrating timing of the data pattern analysis unit shown in FIG. 7.

FIG. 8 is a timing diagram illustrating timing of the data pattern analysis unit shown in FIG. 7. Referring to FIGS. 6, 7 and 8, during time T1, the current data bit CDB and the previous data bit PDB are toggled. Here, the input control signal IN_CONT is not activated.

However, during time T2, when the current data bit CDB and the previous data bit PDB are in a constant state (e.g., in a high state or in a low state) or are rarely toggled, the input control signal IN_CONT may be toggled.

In some embodiments, the period of the clock signal CK may be a unit interval UI of the data pattern DP. Moreover, a width of the input control signal IN_CONT may correspond to a data transmission rate of the data pattern DP. For example, when data in the data pattern DP is in a high state or in a low state, the input control signal IN_CONT may be in a high state or in a low state.

Figure 9:
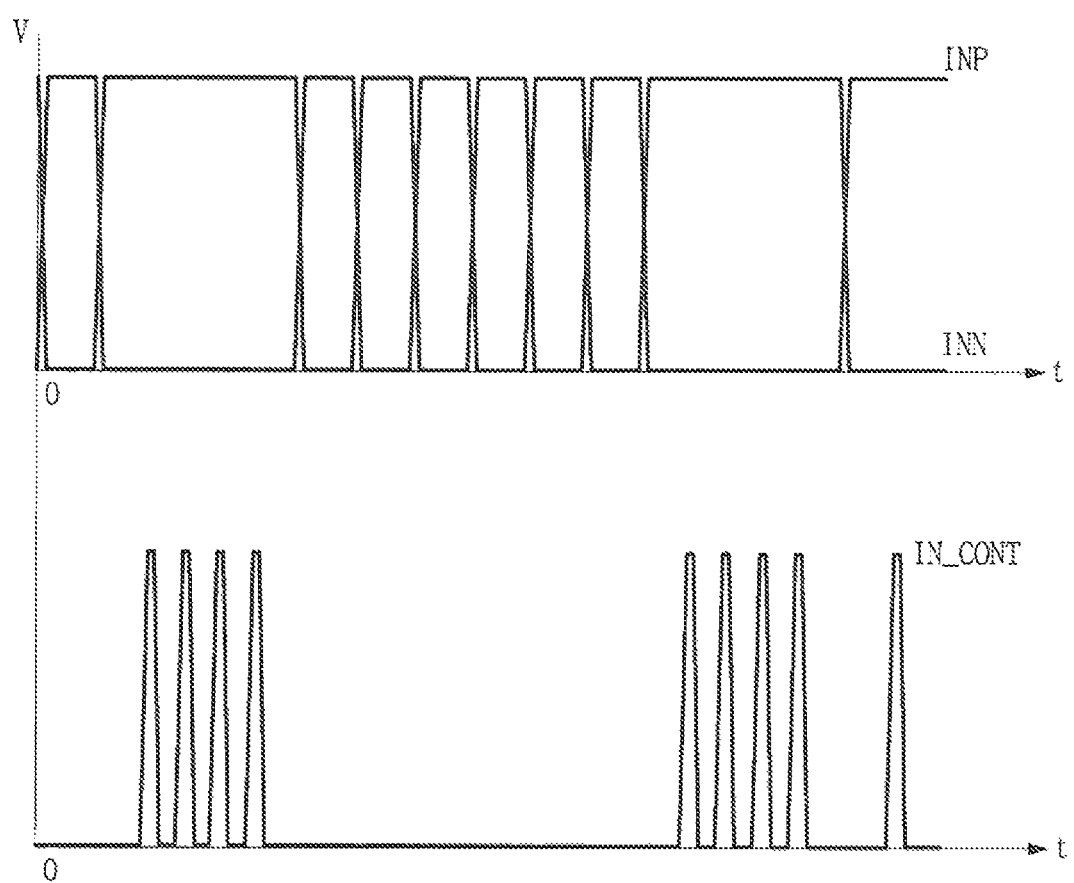
FIG. 9 is a timing diagram illustrating a data pattern and a control signal in the voltage mode driver shown in FIG. 6.

FIG. 9 is a timing diagram illustrating the data pattern DP and the control signal IN_CONT in the voltage mode driver shown in FIG. 6. Referring to FIGS. 6 and 9, the voltage mode driver 110 according to embodiments of the inventive concepts may transmit the data pattern DP to the receiver 120 through the transmission line 130. The transmission line 130 may include a positive differential data line PDDL and a negative differential data line NDDL.

The voltage mode driver 110 may transmit an input positive data pattern INP to the receiver 120 through the positive differential data line PDDL. Further, the voltage mode driver 110 may transmit an input negative data pattern INN to the receiver 120 through the negative differential data line NDDL. Here, in an interval that the input positive data pattern INP and the negative data pattern INN are not toggled, the input control signal IN_CONT may be toggled.

Figure 10:
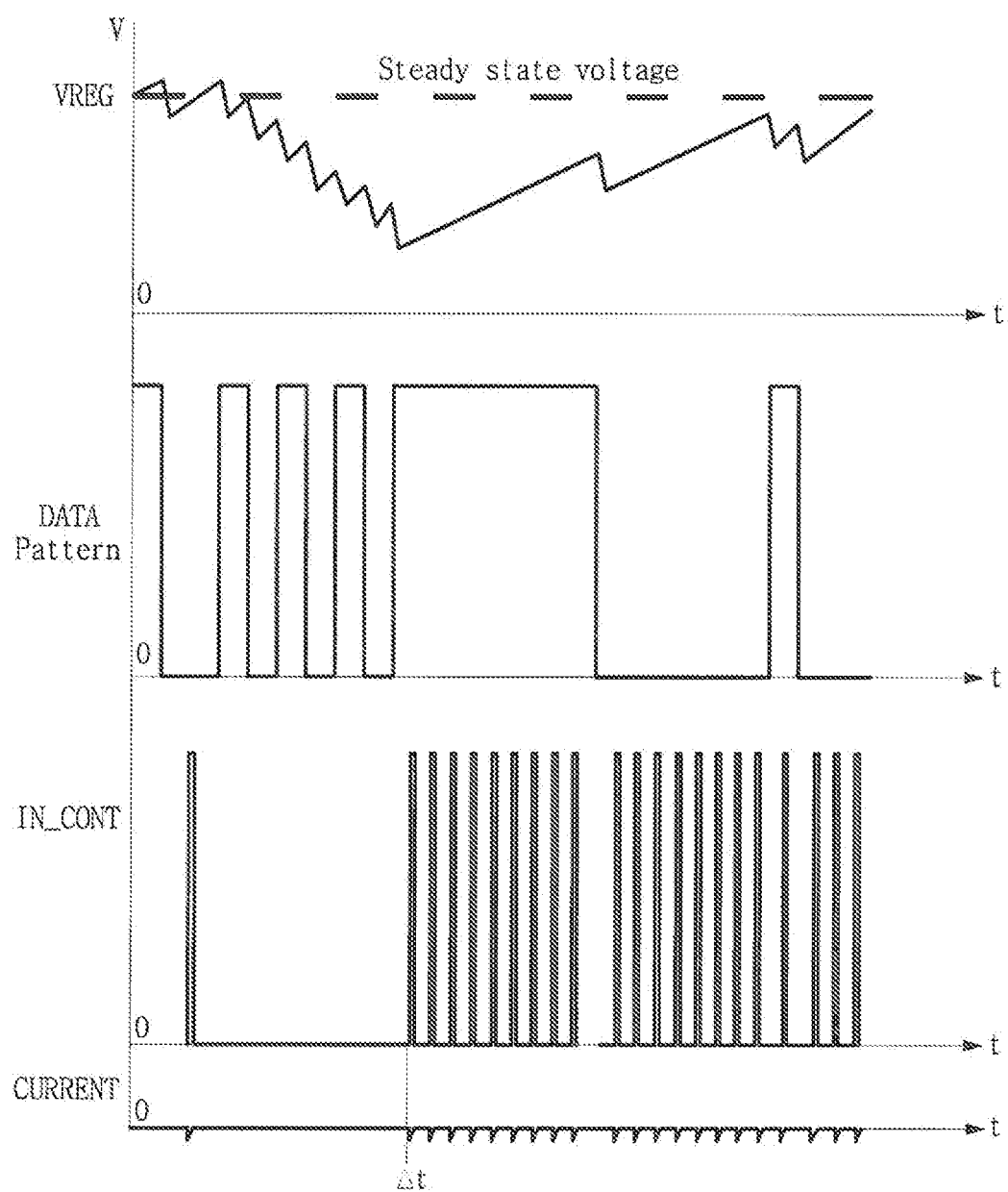
FIG. 10 is a timing diagram illustrating a regulator voltage, a data pattern, an input control signal, and a consumption current in the voltage mode driver shown in FIG. 6.

FIG. 10 is a timing diagram illustrating a regulator voltage, a data pattern, an input control signal, and a consumption current in the voltage mode driver shown in FIG. 6. Referring to FIGS. 6 and 10, the voltage regulator 111 may output a regulation voltage VREG, which is a reference voltage, to the first node N1.

Here, according to the data pattern DP, a ripple may occur in the voltage regulator 111. The ripple may be dependent on the data pattern DP. For example, when the data pattern DP is toggled, the ripple may fluctuate. Further, when the data pattern DP is not toggled, the ripple may monotonically increase.

The voltage mode driver 110 according to embodiments of the inventive concepts may generate the input control signal IN_CONT having a pulse form, while the data pattern DP is not changed.

In response to the input control signal IN_CONT, the fifth switch SW5 may be activated. Accordingly, as the input control signal IN_CONT is activated, a current spike may be generated by the load in the ripple compensation unit 112 due to the fifth resistor R5. A current Δt which may be generated corresponding to the input control signal IN_CONT may be consumed, while the input control signal IN_CONT is in a high state.

Figure 11:
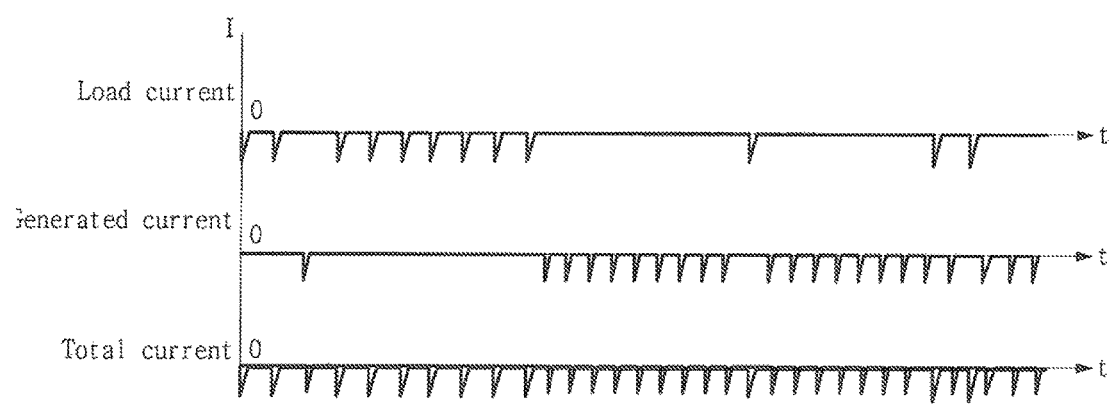
FIG. 11 is a timing diagram illustrating a load current by the voltage mode driver shown in FIG. 6, a current by the ripple compensation unit, and a total current.

FIG. 11 is a timing diagram illustrating a load current by the voltage mode driver 110 shown in FIG. 6, a current generated by the ripple compensation unit 112, and a total current. Referring to FIGS. 6 and 11, the load current by the voltage mode driver 110 may be consumed in synchronization with a toggle of the data pattern DP. A current generated by the ripple compensation unit 112 may correspond to the input control signal IN_CONT. Accordingly, the generated current may be synchronized with the input control signal IN_CONT. A total current may be the sum of the load current and the generated current.

The total current may be consumed similar to a pulse signal having a constant period. That is, the total current may be consumed in accordance with a period of the data pattern DP. Accordingly, an effect of the data pattern-dependent ripple depending on the data pattern DP may be reduced. Further, owing to the reduction of the ripple, jitter which is generated in the voltage mode driver 110 may be reduced.

Figure 12:
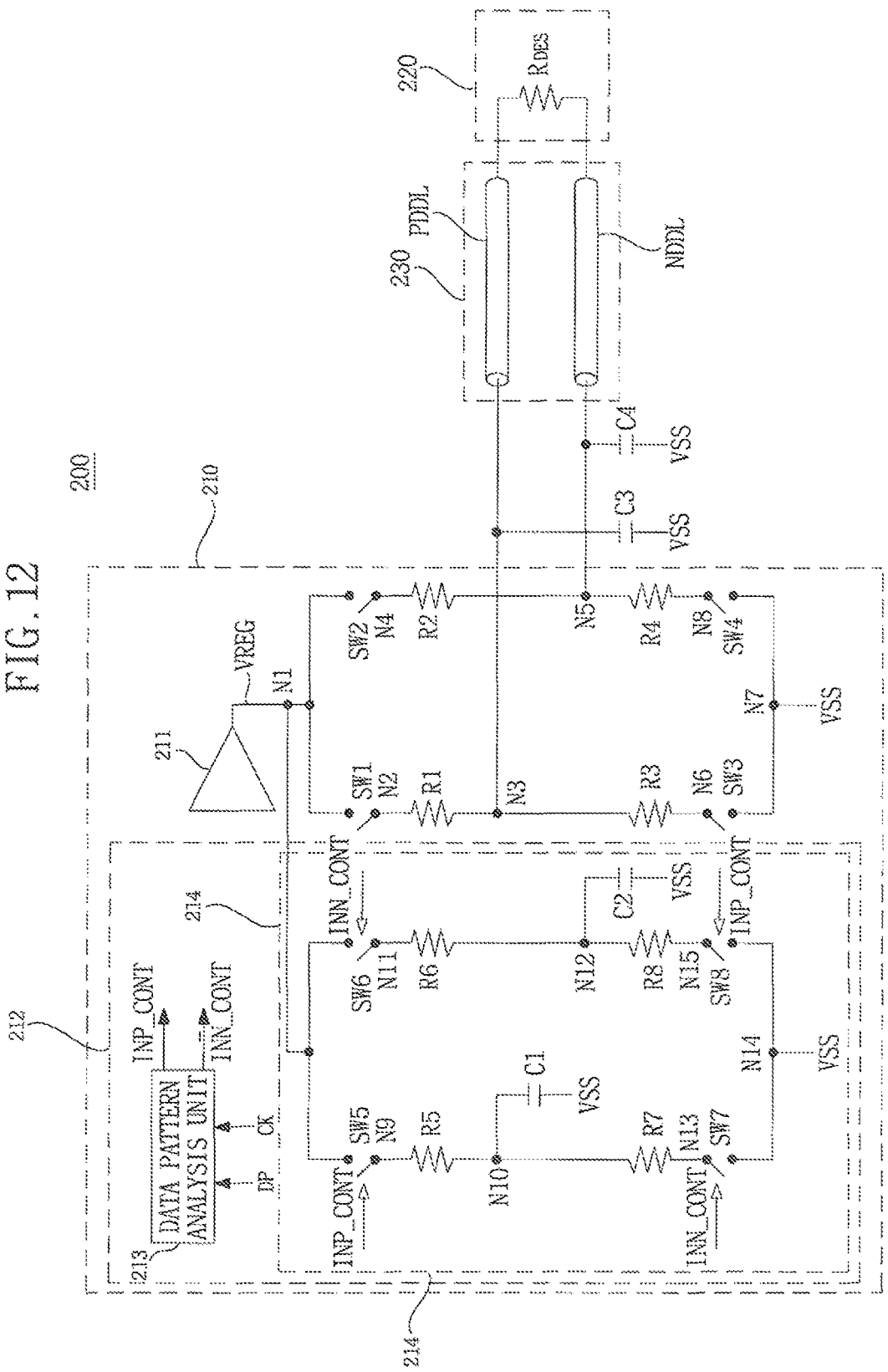
FIG. 12 is a circuit diagram illustrating a voltage mode driver according to other embodiments of the inventive concepts.

FIG. 12 is a circuit diagram illustrating a voltage mode driver according to other embodiments of the inventive concepts. Referring to FIG. 12, an electronic apparatus 200 according to other embodiments of the inventive concepts may include a voltage mode driver 210, a receiver 220, and a transmission line 230.

The voltage mode driver 210 according to other embodiments of the inventive concepts may include may include a voltage regulator 211. Further, the voltage mode driver 210 may further include first to fourth switches SW1 to SW4 and first to fourth resistors R1 to R4.

Specifically, the voltage regulator 211 may be connected to a first node N1. The voltage regulator 211 may apply a regulation voltage VREG to the first node N1.

The first switch SW1 may be connected between the first node N1 and a second node N2. The first resistor R1 may be connected between the second node N2 and a third node N3. The second switch SW2 may be connected between the first node N1 and a fourth node N4. The second resistor R2 may be connected between the fourth node N4 and a fifth node N5.

The third resistor R3 may be connected between the third node N3 and a sixth node N6. The third switch SW3 may be connected between the sixth node N6 and a seventh node N7. The fourth resistor R4 may be connected between the fifth node N5 and a eighth node N8. The fourth switch SW4 may be connected between the eighth node N8 and the seventh node N7. Moreover, a ground voltage VSS may be applied to the seventh node N7.

The transmission line 230 may include a positive differential data fine PDDL and a negative differential data line NDDL, which may each have an impedance of Z0. The positive differential data line PDDL may be connected between the third node N3 and the receiver 220. The negative differential data line NDDL may be connected between the fifth node N5 and the receiver 220. In some embodiments, each of the positive differential data line PDDL and the negative differential data line NDDL may have an inverse phase to each other. The receiver 220 may be modeled with a deserialization resistor $R_{DES}$.

Each of the first to fourth resistors R1 to R4 may have a resistance value for matching an impedance of the receiver 220. For example, when the impedance of the receiver 220 has a resistance value of "R," each of the first to fourth resistors R1 to R4 may have a resistance value of "R/2."

A data pattern in the electronic apparatus 200 is non-uniform. Because output impedance of the voltage regulator 211 is not "0," a ripple on the output terminal of the voltage regulator 211 may occur. Due to the ripple, jitter in the electronic apparatus 200 may increase.

To solve the above problem, the voltage mode driver 210 may further include a ripple compensation unit 212. The ripple compensation unit 212 may include a data pattern analysis unit 233 and a replica circuit 214.

The data pattern analysis unit 213 may receive a data pattern DP and a clock signal CK. For example, the data pattern analysis unit 213 may receive the serialized data pattern DP.

The data pattern analysis unit 213 may extract a current data bit and a previous data bit from the data pattern DP. Generally, the clock, signal CK, which is constant, may be free of jitter which is dependent on the data pattern DP. The data pattern analysis unit 213 may compare the current data bit with the previous data bit in synchronization with the clock signal CK.

In an embodiment, the data pattern analysis unit 213 may compare the current data bit with the previous data bit in synchronization with a rising edge and a falling edge of the clock signal CK.

When the current data bit is equal to the previous data bit, the data pattern analysis unit 313 may generate an input positive control signal INP_CONT and an input negative control signal INN_CONT during one cycle of the clock signal CK. In some embodiments, the input positive control signal INP_CONT may have an inverse phase with the input negative control signal INN_CONT. A period of the clock signal CK may be a unit interval UI of the data pattern DP.

The replica circuit 214 may include fifth to eighth switches SW5 to SW8, fifth to eighth resistors R5 to R8, and first and second load capacitors C1 and C2.

The fifth switch SW5 may be connected between the first node N1 and a ninth node N9. The fifth resistor R5 may be connected between the ninth node N9 and a tenth node N10. The sixth switch SW6 may be connected between the first node N1 and an eleventh node N11. The sixth resistor R6 may be connected between the eleventh node N11 and a twelfth node N12.

The seventh resistor R7 may be connected between the tenth node N10 and a thirteenth node N13. The seventh switch SW7 may be connected between the thirteenth node N13 and a fourteenth node N14. The eighth resistor R8 may be connected between the twelfth node N12 and a fifteenth node N15. The eighth switch SW8 may be connected between the fifteenth node N15 and the fourteenth node N14. Moreover, a ground voltage VSS may be applied to the fourteenth node N14.

Moreover, the first capacitor C1 may be connected between the tenth node N10 and a node to which the ground voltage VSS is applied. The second capacitor C2 may be connected between the twelfth node N12 and a node to which the ground voltage VSS is applied.

The transmission line 230 may include a positive differential data line PDDL and a negative differential data line NDDL, which may each have an impedance of Z0. The positive differential data line PDDL may be connected between the third node N3 and the receiver 220. The negative differential data line NDDL may be connected between the fifth node N5 and the receiver 220. In some embodiments, each of the positive differential data line PDDL and the negative differential data line NDDL may have an inverse phase to each other.

Further, a third capacitor C3 may be connected between the third node N3 and a node to which the ground voltage VSS is applied. A fourth capacitor C4 may be connected between the fifth node N5 and a node to which the ground voltage VSS is applied. The first to fourth capacitors C1 to C4 may determine a magnitude of a switching current. In some embodiments, the first to fourth capacitors C1 to C4 may have the same capacitance. Though first through fourth capacitors C1 through C4 are illustrated within FIG. 12, the present inventive concepts are not limited thereto. In some embodiments, the first through fourth capacitors C1 through C4, and their connections to the ground voltage VSS, may not be present.

The receiver 220 may be modeled with a deserialization resistor $R_{DES}$. Each of the first to fourth resistors R1 to R4 may have a resistance value for matching impedance of the receiver 220. For example, when the impedance of the receiver 220 has a resistance value of "R," each of the first to fourth resistors R1 to R4 may have a resistance value of "R/2." In some embodiments, the resistance values of the fifth resistor through eighth resistors R5 to R8 may be selected so as to create a load within the ripple compensation unit 212 so as to mimic the load generated by the first through fourth switching resistors, R1 to R4 during switching operation of the voltage mode driver 210.

In response to the positive control signal INP_CONT, the fifth switch SW5 and the eighth switch SW8 may be activated. Moreover, in response to the negative control signal INN_CONT, the sixth switch SW6 and the seventh switch SW7 may be deactivated.

For example, while the positive control signal INP_CONT is activated, the fifth switch SW5 and the eighth switch SW8 may be turned on. When the fifth switch SW5 and the eighth switch SW8 are turned on, the first capacitor C1 may be connected to the first node N1 (e.g., an output terminal of the voltage regulator 211). Accordingly, the regulator voltage VREG may be dropped corresponding to the capacitance of the first capacitor C1.

While the negative control signal INN_CONT is activated, the sixth switch SW6 and the seventh switch SW7 may be turned on. When the sixth switch SW6 and the seventh switch SW7 are turned on, the second capacitor C2 may be connected to the first node N1 (e.g., an output terminal of the voltage regulator 211). Accordingly, the regulator voltage VREG may be dropped corresponding to the capacitance of the second capacitor C2.

The data pattern analysis unit 213 according to some embodiments of the inventive concepts will be described in FIG. 13 in detail.

Figure 13:
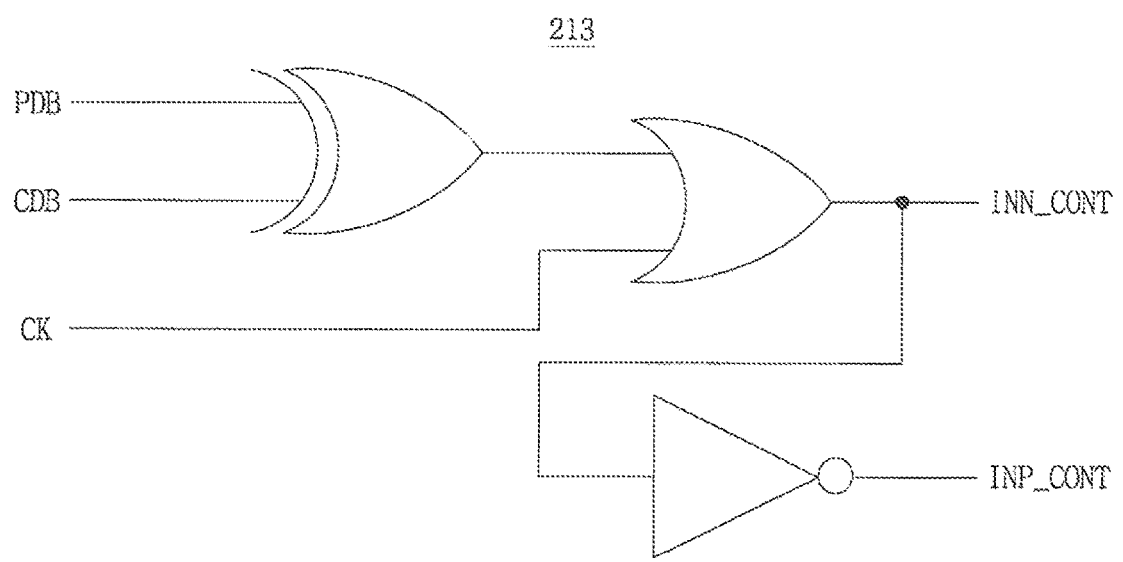
FIG. 13 is a circuit diagram illustrating an embodiment of the data pattern analysis unit shown in FIG. 12 in detail.

FIG. 13 is a circuit diagram illustrating an embodiment of the data pattern analysis unit 213 shown in FIG. 12 in detail. Referring to FIGS. 12 and 13, the data pattern analysis unit 213 according to embodiments of the inventive concepts may receive the serialized data pattern DP.

The data pattern analysis unit 213 may extract a current data bit CDB and a previous data bit PDB, which are from the data pattern DP.

The data pattern analysis unit 213 may compare the current data bit CDB with the previous data bit PDB. When the current data bit CDB is equal to the previous data bit PDB, the data pattern analysis unit 213 may output the positive control signal INP_CONT and the negative control signal INN_CONT in synchronization with the clock signal CK.

The data pattern analysis unit 213 may include an XOR gate, an OR gate and an inverter. The current data bit CDB and the previous data bit PDB may be input to the XOR gate. An output signal of the XOR gate and the clock signal CK may be input to the OR gate. The OR gate may output the negative control signal INN_CONT. Output of the OR gate may be input to the inverter. The inverter may output the positive control signal INP_CONT.

Figure 14:
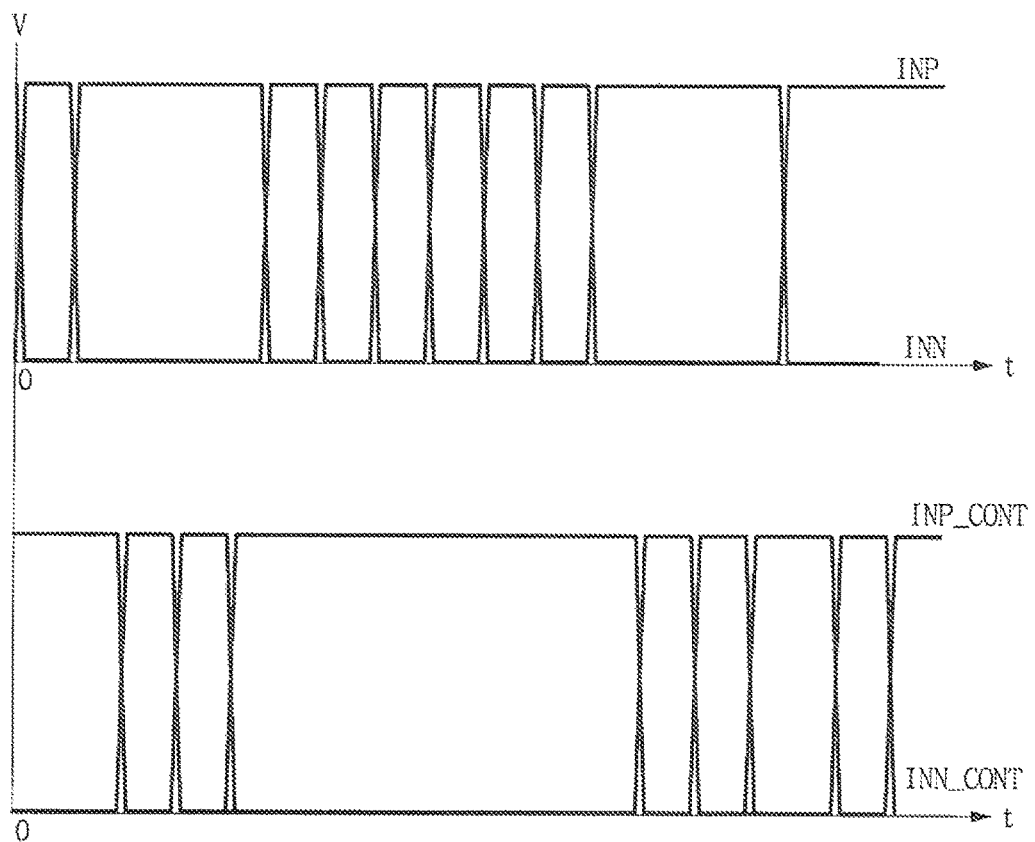
FIG. 14 is a timing diagram illustrating a data pattern, an input positive control signal, and an input negative control signal in the voltage mode driver shown in FIG. 12.

FIG. 14 is a timing diagram illustrating a data pattern, an input positive control signal, and an input negative control signal in the voltage mode driver 210 shown in FIG. 12. Referring to FIGS. 12 and 14, the voltage mode driver 210 according to embodiments of the inventive concepts may transmit the data pattern DP to the receiver 220 through the transmission line 230. The transmission line 230 may include a positive differential data line PDDL and a negative differential data line NDDL.

The voltage mode driver 210 may transmit an input positive data pattern INP to the receiver 220 through the positive differential data line PDDL. Further, the voltage mode driver 210 may transmit an input negative data pattern INN to the receiver 220 through the negative differential data line NDDL. Here, in an interval that the input positive data pattern INP and the negative data pattern INN are not toggled (i.e., remain constant), the positive control signal INP_CONT and the negative control signal INN_CONT may be toggled.

Though FIGS. 6 and 12 illustrate the use of the ground voltage VSS within some embodiments, the present inventive concepts are not limited thereto. Those of skill in the art will recognize that other voltage levels are possible. Similarly, while single resistors are illustrated in FIGS. 6 and 12 within some embodiments, the present inventive concepts are not limited thereto. Those of skill in the art will recognize that other load combinations are possible.

Figure 15:
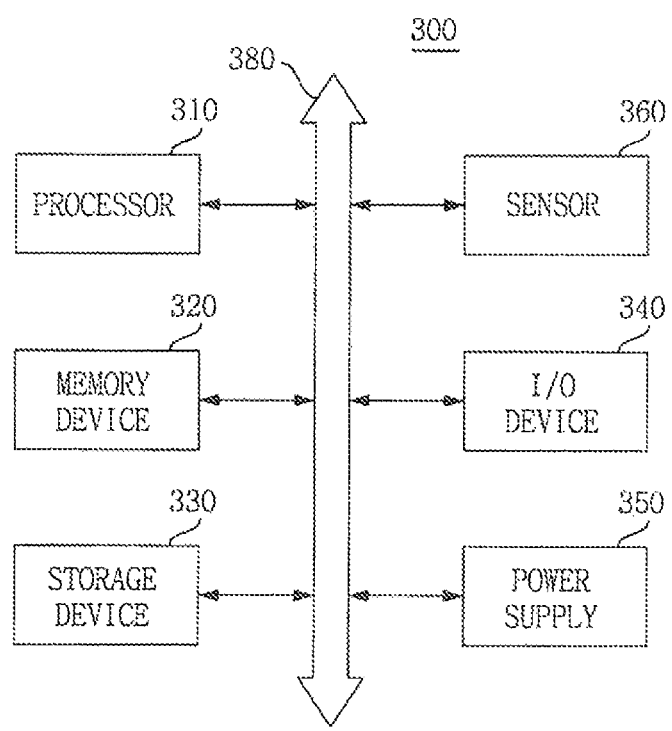
FIG. 15 is a block diagram illustrating a computing system including voltage mode drivers according to embodiments of the present inventive concepts.

FIG. 15 is a block diagram illustrating a computing system including voltage mode drivers 110/210 according to embodiments of the present inventive concepts. Referring to FIG. 15, a computing system 300 may include a processor 310, a memory device 320, a storage device 330, an input/output device 340, a power supply 350, and an image sensor 360 which may be electrically coupled or connected to each other via a bus 380.

Meanwhile, the computing system 300 may communicate with a video card, a sound card, a memory card, a Universal Serial Bus (USB) device, etc.

The processor 310 may perform specific calculations or tasks. In one embodiment, the processor 310 may include a micro-processor and a central processing unit (CPU). The processor 310 may communicate with the memory device 320, the storage device 330, and the input/output device 340 through an address bus, a control bus, and/or a data bus 380.

In one embodiment, the processor 310 may be connected to an extension bus such as a peripheral component interconnect (PCI) bus. Further, the processor 310 may include the voltage mode driver 110 shown in FIG. 6 and/or the voltage mode driver 210 shown in FIG. 12.

The memory device 320 may store data which is needed to operate the computing system 300. For example, the memory device 320 may be embodied in a dynamic random access memory (DRAM), a mobile DRAM, a static random access memory (SRAM), a phase change RAM (PRAM), a ferroelectric RAM (FRAM), a resistive RAM (RRAM) and/or a magnetic RAM (MRAM), etc.

The storage device 330 may include a solid state drive (SSD), a hard disk drive (HDD), an optical disk drive (ODD), a CD-ROM, etc.

The input/output device 340 may include an input device such as a keyboard, a keypad, a mouse, etc. and/or an output device such as a printer, display, etc.

The power supply 350 may supply an operating voltage which is needed to operate the computing system 300.

The image sensor 360 may communicate with the processor 310 through the bus 380 or other communication links. The image sensor 360 and the processor 310 may be integrated in one chip or different chips.

The computing system 300 may include a digital camera, a mobile phone, personal digital assistants, a portable multimedia player, a smart phone, etc.

FIG. 16 is a block diagram illustrating embodiments of an interface which is used in the computing system 300 shown in FIG. 15. Referring to FIG. 16, a computing system 400 may be embodied in a data processing device which is capable of supporting a mobile industry processor interface (MIPI interface), and may include an application processor (AP) 410, an image sensor 440, and a display device 450, etc.

A camera serial interface (CSI) host 412 of the AP may perform a serial communication with a CSI device 441 included in the image sensor 440 through a CSI. In some embodiments, the AP 410 may include the voltage mode driver 110 shown in FIG. 6 and/or the voltage mode driver 210 shown in FIG. 12.

In some embodiments, the CSI host 412 may include a deserializer (DES), and the CSI device 441 may include a serializer (SFR).

A display serial interface (DSI) host 411 in the AP 410 may perform a serial communication with a DSI device 451 in the display device 450 through a DSI. In some embodiments, the DSI host 411 may include a serializer (SER). Moreover, the DST device 451 may include a deserializer (DES).

The computing system 400 may further include a radio frequency (RF) chip 460 which may communicate with the AP 410. A PHY 413 of the AP 410 and a PHY 461 of the RF chip 460 may perform a data communication according to a MIPI DigRF. Further, the AP 410 may further include a DigRF MASTER 414 which controls the data communication according to the MIPI DigRF of the PRY 413.

The computing system 400 may include a global positioning system (GPS) 420, storage 470, a microphone 481, a speaker 482, and a DRAM 483.

Further, the computing system 400 may communicate with other devices using a worldwide interoperability for microwave access (WiMAX) 491, a wireless local area network (WLAN) 492, and/or an ultra wideband (UWB) 493.

The voltage mode driver 110/210 according to embodiments of the inventive concepts can compensate for a data pattern-dependent ripple. Accordingly, the voltage mode driver 110/210 can reduce jitter by compensating for the data pattern-dependent ripple.

The embodiments of the inventive concepts can be applied to an application processor or a system-on-chip (SoC), which may include the voltage mode driver 110/210.

In some embodiments, the present inventive concepts may provide a voltage mode driver with a uniform ripple on the output of the voltage mode driver. Ripple may be a variation in the output signal of the voltage mode driver. Ripple may be caused by sudden variations in a circuit such as with a current spike. The switching circuit may generate ripple at the output of the voltage mode driver while a data pattern being output by the switching circuit is transitioning, but may not generate ripple, or may generate a different ripple signal, at the output of the voltage mode driver when the data pattern being output by the switching circuit is constant. The uniform ripple on the output of the voltage mode drier may be generated by a ripple generation circuit connected to the switching circuit of the voltage mode driver. The ripple generation circuit may provide uniform ripple at the output of the voltage mode driver by generating ripple, when the data pattern being output by the switching circuit is constant, that is substantially similar to the ripple generated by the switching circuit when the data pattern being output by the switching circuit is transitioning. Thus, the ripple generating circuit may generate a data-dependent ripple within the voltage mode driver. In some embodiments, the voltage mode driver is capable of compensating for a data pattern—dependent ripple by providing a uniform ripple.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of these inventive concepts as defined in the claims. In the claims, means-plus-function clauses are intended to cover the structures described herein as performing the recited function, and not only structural equivalents but also equivalent structures.

What is claimed is:

1. A voltage mode driver comprising:
a voltage regulator; and
a ripple compensation unit connected to an output terminal of the voltage regulator and configured to:
compare a current data bit of a data pattern with a previous data bit of the data pattern in synchronization with a clock signal;
generate a control signal when the current data bit is equal to the previous data bit; and
apply a ground voltage to the output terminal in response to the control signal.

2. The voltage mode driver of claim 1, further comprising:
a first switch connected between a first node and a second node;
a first resistor connected between the second node and a third node;
a second switch connected between the first node and a fourth node;
a second resistor connected between the fourth node and a fifth node;
a third switch connected between a sixth node and a seventh node;
a third resistor connected between the third node and the sixth node;
a fourth switch connected between an eighth node and the seventh node; and
a fourth resistor connected between the fifth node and the eighth node,
wherein the output terminal of the voltage regulator is connected to the first node and a ground voltage is applied to the seventh node.

3. The voltage mode driver of claim 2, further comprising a receiver connected to the voltage mode driver by a transmission line,
wherein each of the first to fourth resistors has a resistance value for matching an impedance of the receiver.

4. The voltage mode driver of claim 1, wherein the ripple compensation unit receives the data pattern and extracts the previous data bit and the current data bit from the data pattern.

5. The voltage mode driver of claim 4, wherein the ripple compensation unit operates in synchronization with a rising edge and a falling edge of the clock signal and a period of the clock signal is a unit interval of the data pattern.

6. The voltage mode driver of claim 4, wherein a width of the control signal corresponds to a data transmission rate of the data pattern.

7. The voltage mode driver of claim 4, wherein the voltage mode driver transmits the data pattern to a receiver through a transmission line.

8. A voltage mode driver comprising:
a voltage regulator; and
a replica circuit connected to an output terminal of the voltage regulator and configured to:
compare a current data bit of a data pattern with a previous data bit of the data pattern in synchronization with a clock signal;
generate a first control signal and a second control signal when the current data bit is equal to the previous data bit; and
apply a ground voltage to the output terminal in response to the first control signal or the second control signal.

9. The voltage mode driver of claim 8, further comprising:
a first switch connected between a first node and a second node;
a first resistor connected between the second node and a third node;
a second switch connected between the first node and a fourth node;
a second resistor connected between the fourth node and a fifth node;
a third switch connected between a sixth node and a seventh node;
a third resistor connected between the third node and the sixth node;
a fourth switch connected between an eighth node and the seventh node; and
a fourth resistor connected between the fifth node and the eighth node,
wherein the output terminal of the voltage regulator is connected to the first node and a ground voltage is applied to the seventh node.

10. The voltage mode driver of claim 9, wherein the replica circuit comprises:
a fifth switch connected between the first node and a ninth node;
a fifth resistor connected between the ninth node and a tenth node;
a sixth switch connected between the first node and an eleventh node;
a sixth resistor connected between the eleventh node and a twelfth node;
a seventh resistor connected between the tenth node and a thirteenth node;
a seventh switch connected between the thirteenth node and a fourteenth node;
an eighth resistor connected between the twelfth node and a fifteenth node; and
an eighth switch connected between the fourteenth node and the fifteenth node,
wherein the ground voltage is applied to the fourteenth node,
wherein the fifth switch and the eighth switch are activated in response to the first control signal, and
wherein the sixth switch and the seventh switch are activated in response to the second control signal.

11. The voltage mode driver of claim 10, further comprising a receiver connected to the voltage mode driver by a transmission line,
wherein each of the first to eighth resistors has a resistance value for matching an impedance of the receiver.

12. The voltage mode driver of claim 8, wherein the replica circuit receives the data pattern and extracts the previous data bit and the current data bit from the data pattern.

13. The voltage mode driver of claim 12, wherein the replica circuit operates in synchronization with a rising edge and a falling edge of the clock signal and a period of the clock signal is a unit interval of the data pattern.

14. The voltage mode driver of claim 12, wherein a width of the first control signal or the second control signal corresponds to a data transmission rate of the data pattern.

15. The voltage mode driver of claim 8, wherein each of the first control signal and the second control signal have an inverse phase to each other.

16. A voltage mode driver comprising:
a voltage regulator;
a switching circuit connected to an output terminal of the voltage regulator, connected to an output terminal of the voltage mode driver, and configured to output a data pattern,
wherein the switching circuit comprises a plurality of resistors which generate a first electrical load; and
a data-dependent ripple generation circuit connected to the output terminal of the voltage regulator and configured to generate uniform ripple in the output of the voltage mode driver.

17. The voltage mode driver of claim 16, wherein the data-dependent ripple generation circuit is configured to generate uniform ripple in the output of the voltage mode driver by connecting a second electrical load to the output terminal of the voltage mode driver in response to a comparison of a current data bit of the data pattern with a previous data bit of the data pattern in synchronization with a clock signal.

18. The voltage mode driver of claim 17, wherein the first electrical load and the second electrical load are substantially the same.

19. The voltage mode driver of claim 17, wherein the data-dependent ripple generation circuit comprises:
a load resistor connected between the output terminal of the voltage mode driver and a first node;
a first switch connected between the first node and a second node,
wherein the first switch is controlled by a control signal; and
a data pattern analysis unit configured to:
compare the current data bit of the data pattern with the previous data bit of the data pattern in synchronization with the clock signal; and
generate the control signal when the current data bit is equal to the previous data bit.

20. The voltage mode driver of claim 17, wherein the switching circuit comprises:
a first switch connected between a first node and a second node;
a first resistor connected between the second node and a third node;
a second switch connected between the first node and a fourth node;
a second resistor connected between the fourth node and a fifth node;
a third switch connected between a sixth node and a seventh node;
a third resistor connected between the third node and the sixth node:
a fourth switch connected between an eighth node and the seventh node; and
a fourth resistor connected between the fifth node and the eighth node,
wherein the output terminal of the voltage regulator is connected to the first node, and
wherein the ripple compensation circuit comprises:
a data pattern analysis unit configured to:
compare the current data bit of the data pattern with the previous data bit of data pattern in synchronization with the clock signal; and
generate a first control signal and a second control signal in synchronization with the clock signal when the current data bit is equal to the previous data bit;
a fifth switch connected between the first node and a ninth node;
a fifth resistor connected between the ninth node and a tenth node;
a sixth switch connected between the first node and an eleventh node;
a sixth resistor connected between the eleventh node and a twelfth node;
a seventh resistor connected between the tenth node and a thirteenth node;
a seventh switch connected between the thirteenth node and a fourteenth node;
an eighth resistor connected between the twelfth node and a fifteenth node;
an eighth switch connected between the fourteenth node and the fifteenth node;
a first capacitor between, the tenth node and a sixteenth node; and
a second capacitor between the twelfth node and a seventeenth node,
wherein the fifth switch and the eighth switch are activated in response to the first control signal, and
wherein the sixth switch and the seventh switch are activated in response to the second control signal, and
wherein the voltage mode driver further comprises:
a third capacitor between the third node and an eighteenth node; and
a fourth capacitor between the fifth node and a nineteenth node.

* * * * *